United States Patent
Biles et al.

(10) Patent No.: US 6,566,269 B1
(45) Date of Patent: May 20, 2003

(54) REMOVAL OF POST ETCH RESIDUALS ON WAFER SURFACE

(75) Inventors: Peter J. Biles, Orlando, FL (US); Mario V. Pita, Winter Springs, FL (US); Sylvia M. Luque, Orlando, FL (US); Lauri M. Nelson, Orlando, FL (US); Robert H. Mills, Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 86 days.

(21) Appl. No.: 09/616,845

(22) Filed: Jul. 14, 2000

(51) Int. Cl.$^7$ .................... H01L 21/302; H01L 21/3065
(52) U.S. Cl. .................. 438/706; 438/712; 438/723; 438/724
(58) Field of Search ................ 438/706, 712, 438/723, 724

(56) References Cited

U.S. PATENT DOCUMENTS

| | | | | |
|---|---|---|---|---|
| 5,015,330 A | * | 5/1991 | Okumura et al. ............ 156/643 |
| 5,135,608 A | * | 8/1992 | Okutani ...................... 438/584 |
| 5,227,001 A | * | 7/1993 | Tamaki et al. ................ 156/35 |
| 5,380,401 A | * | 1/1995 | Jones et al. .................. 438/712 |
| 5,433,823 A | * | 7/1995 | Cain ......................... 156/662.1 |
| 5,468,686 A | | 11/1995 | Kawamoto .................. 438/714 |
| 5,733,808 A | * | 3/1998 | Tseng .......................... 438/239 |
| 5,893,734 A | * | 4/1999 | Jeng et al. ................... 438/293 |
| 5,911,887 A | | 6/1999 | Smith et al. .................... 216/72 |
| 5,912,044 A | * | 6/1999 | Farooq et al. ................. 427/79 |
| 5,985,765 A | | 11/1999 | Hsiao et al. ................. 438/694 |
| 6,006,764 A | | 12/1999 | Chu et al. ..................... 134/1.2 |
| 6,046,115 A | | 4/2000 | Mollov et al. ............... 438/710 |

* cited by examiner

*Primary Examiner*—Robert Kunemund
*Assistant Examiner*—Lynette J. Umez-Erenini

(57) ABSTRACT

The present invention provides a method of plasma chamber etching of a semiconductor structure having a base layer, an etch stop layer, a dielectric material layer and a patterned photoresist layer. Among other things, the method may include etching selected portions of the dielectric material layer through the photoresist layer using a plasma etchant containing at least one of fluorine and sulfur in a compound such that portions of the photoresist layer may be contaminated with ions of the at least one of the fluorine and sulfur. The method may further include the steps of exhausting the etchant from the plasma chamber, introducing an oxygen containing gas into the plasma chamber, energizing the plasma reactor to create at least oxygen ions for bombarding the photoresist surface to remove at least a portion of the photoresist containing a majority of the contaminating one of the fluorine and sulfur ions whereby the fluorine and sulfur ions combine with other ions in the oxygen containing gas during at least exhaustion of the gas from the chamber, and removing the semiconductor structure containing a remaining portion of the photoresist from the plasma chamber.

20 Claims, 2 Drawing Sheets

REMOVAL OF POST ETCH RESIDUALS ON WAFER SURFACE

The present invention relates to processing of semiconductor wafers using a plasma etching process and, more particularly, to a method for removing contaminants from a photoresist layer on such wafers.

BACKGROUND OF THE INVENTION

Manufacture of an integrated circuit device involves numerous process steps to create active and passive devices on a semiconductor substrate, to create conductive leads for connecting such devices and to create conductive pads for external connection to the completed device. In the fabrication of semiconductor components, the various devices are formed in layers upon an underlying substrate typically composed of silicon, germanium, or gallium arsenide. Metal conductor lines form interconnects between the various discrete devices. The metal conductor lines are further insulated from the next interconnection level by thin films of insulating material deposited by, for example, CVD (Chemical Vapor Deposition) of oxide or application of SOG (Spin On Glass) layers followed by fellow processes. Holes, or vias, formed through the insulating layers provide electrical connectivity between successive conductive interconnection layers. In general, areas to be etched or removed are defined by lithographic patterns outlined by a carbon containing photoresist layer on an exposed surface of the device. Etching is achieved by exposing the photoresist covered layer to a chemical compound that will desolve a layer to be removed but which compound will not attack the photoresist. In many processes for device fabrication, a pattern defined by the lithographic technique is transferred through a layer of material formed on the surface of a substrate. Typically, the pattern is transferred by etching using a plasma. The term plasma, as used in this disclosure, refers to a partially ionized gas consisting of positively and negatively charged molecular species, as well as neutrals.

Plasma etching processes are typically performed in an apparatus such as a plasma reactor. Plasma reactors generally include a reaction chamber, a plasma generating system, a wafer holder and handling system and a gas delivery system (i.e. inlet, exhaust and flow control). The term reaction chamber, as used in this disclosure, refers to the area within a plasma reactor where ionized gases physically and/or chemically interact with a material layer formed on the surface of a substrate.

A cross-sectional view of an example of a plasma reactor, called a parallel plate reactor 10 is shown in FIG. 1. Parallel plate reactor 10 includes two electrodes 11, 12 positioned parallel to each other in a reaction chamber 14. Substrates 15 with lithographically defined patterns (not shown) formed thereon are placed on the surface 12a of electrode 12. In a typical etching process using a plasma reactor such as a parallel plate reactor 10, gases are mixed and introduced into the reaction chamber 14. The mixed gases flow between electrodes 11, 12. An electric field applied between electrodes 11, 12 ionizes the gases and forms a plasma 13. The plasma 13 then etches the layer of material (not shown) formed on the surface of substrates 15 and transfers the lithographically defined pattern therethrough.

FIGS. 2A through 2C are diagrammatic cross-sectional views depicting exemplary processing steps involved in constructing an integrated circuit device with post contact and via holes. In FIG. 2A, there is shown a semiconductor substrate 16, having disposed thereon a plurality of transistors or diodes, shown generally as active regions 22. A first dielectric layer 24 is deposited over the substrate, which may be comprised of a thin film of silicon-dioxide, SiO.sub.2, or other dielectric materials such as a-Ta.sub.2 O.sub.5, a-TiO.sub.x, or x-(Ba,Sr)TiO.sub.3. An etch stop layer 26 comprised, for example, of silicon nitride, may be deposited over the dielectric layer. Contact holes 28 (shown in FIG. 2C) are formed in the device of FIG. 2A to provide contact with the active regions 22 of the substrate 16. The etching of the device to form the contact holes 28 often is performed with a photoresist mask and dry etching process involving use of a plasma RIE process and a reactive gas, such as CHF.sub.3 or SF.sub.6. Referring to FIG. 2B, a photosensitive mask may be used to deposit a photoresist layer 20, over selected regions of the etch stop layer 16. The exposed portions of the etch stop layer 26 and dielectric layer 24 are controllably etched with the reactive etchant to expose the active regions 22 and provide contact holes 28 (FIG. 2C).

One of the latter steps in fabrication of the semiconductor integrated circuit is the formation of bonding pads which enable connection of the integrated circuit to an external device, i.e., the bonding pads create a connection point for electrical conductors. Bonding pads are formed by deposition of a conductive material layer at desired areas of an integrated circuit, typically by successively depositing a patterned conductive material layer, a dielectric material layer and a passivation material layer, followed by patterned etching of the passivation and dielectric layers, providing an exposed surface of the conductive material. Etching is performed in the plasma chamber using gases such as $SF_6$, $CHF_3$, and $CF_4$, to etch silicon nitride ($Si_3N_4$), silicon dioxide ($SiO_2$) and titanium nitrate (TiN), respectively. During bond pad etching, the semiconductor wafer surface is covered with a photoresist layer to prevent etching at areas other than the bond pads. The etching process releases fluorine and sulfur which contaminate the photoresist layer. When the wafer is removed from the plasma chamber and exposed to ambient conditions, the wafers outgas the fluorine and sulfur which then combine with moisture in the air to form $SO_2$ and HF. Since the wafers are placed in a protective wafer box upon removal from the plasma chamber, these gases are trapped in the box until opened by a human operator. The operator is then exposed to an obnoxious smell. More importantly, these gases may corrode or formed an oxide layer on the bonding pads that can adversely effect electrical continuity when electrical conductors are subsequently attached. Accordingly, it would be desireable to provide a method for neutralizing or removing the gas contaminants before exposure to ambient conditions.

SUMMARY OF THE INVENTION

The above described detriments of the prior art are addressed in one embodiment of the present invention by providing a method for effecting outgassing of contaminants from semiconductor wafers immediately subsequent to plasma etching of such wafers. In an exemplary form, the invention is illustrated in a plasma etch process for wafer bonding pads in which fluorine and sulfur ions are trapped as contaminants in a photoresist layer of the wafer. The inventive process comprises exhausting of the etchant gases from the plasma chamber and introducing a mixture of argon and oxygen at a controlled rate and pressure so that the fluorine and sulfur outgas in the plasma chamber prior to removal of the wafer therefrom. More particularly, power is applied to the reactor to create a plasma of at least some of the argon and oxygen gases such that the resultant $Ar^-$ and $O^+$ ions bombard the photoresist surface and remove at least an outer portion in which a majority of the fluorine and sulfur ions are entrapped. The fluorine and sulfur ions are then exhausted from the reactor with the argon and oxygen, combining with carbon ions from the photoresist and oxygen ions to form $CF_2$ and $SO_2$.

In one embodiment, the argon/oxygen mixture is flowed in the plasma chamber for a time period of about 10 seconds at a pressure of about 100 mTorr and a power level of 500 watts but without a magnetic field. The argon gas is flowed at about 50 sccm and the oxygen is flowed at about 18 sccm.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Applicants have discovered a new method for removing the fluorine and sulfur contaminants trapped in the photoresist layer of a semiconductor wafer during plasma gas etching of bonding pads and other features. The new method eliminates undesireable odors caused by outgassing under ambient conditions and further minimizes opportunity for corrosion of bonding pads from outgassing of fluorine and sulfur and formation of corrosive compounds. In the inventive process, semiconductor wafers are held in the plasma chamber for about an additional 10 seconds subsequent to plasma etching. During that 10 second interval, a flow of argon and oxygen passes over the wafers and serves to combine with and extract the fluorine and sulfur contaminants from the photoresist layer of the wafer. Thus, after about 10 seconds, the wafers may be removed from the plasma chamber and placed in a wafer box without further concern for outgassing of the fluorine and sulfur.

Figure 1:
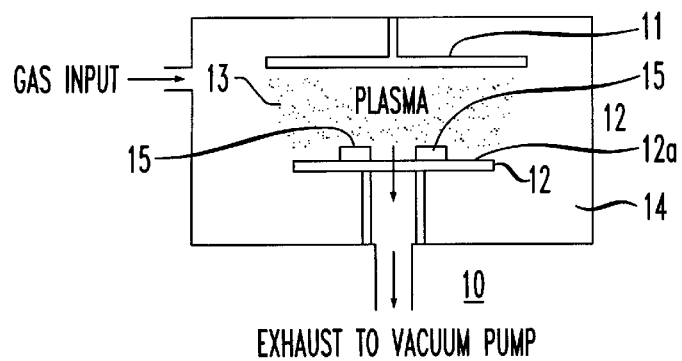
FIG. 1 is a cross-sectional view of a parallel plate plasma reaction chamber.
Figure 2A:
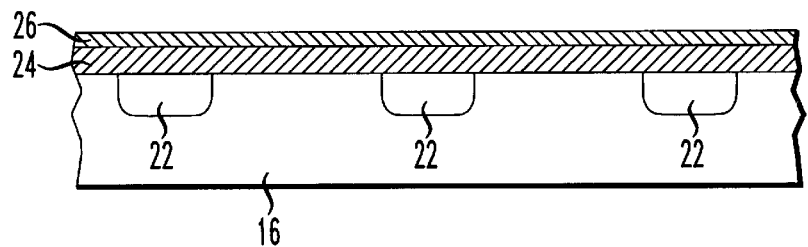
FIGS. 2A–2C are diagrammatic cross-sectional views depicting exemplary processing steps involved in constructing an integrated circuit device with post contact and via holes.
Figure 2B:
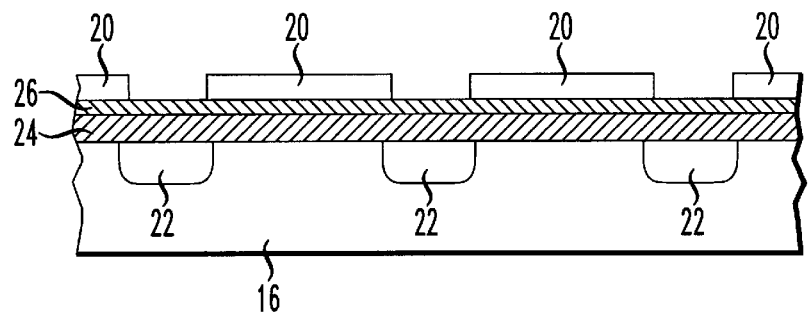
Figure 2C:
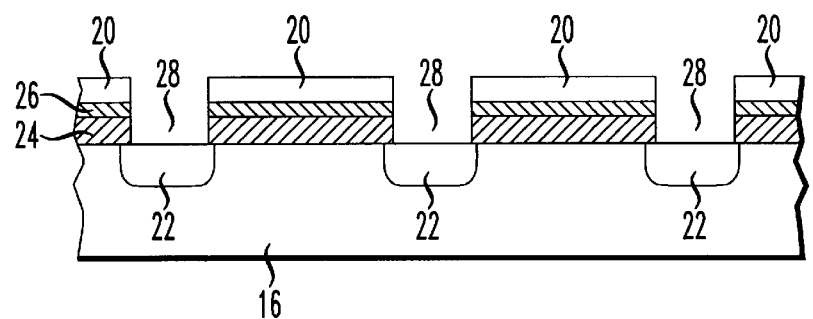
Figure 3:
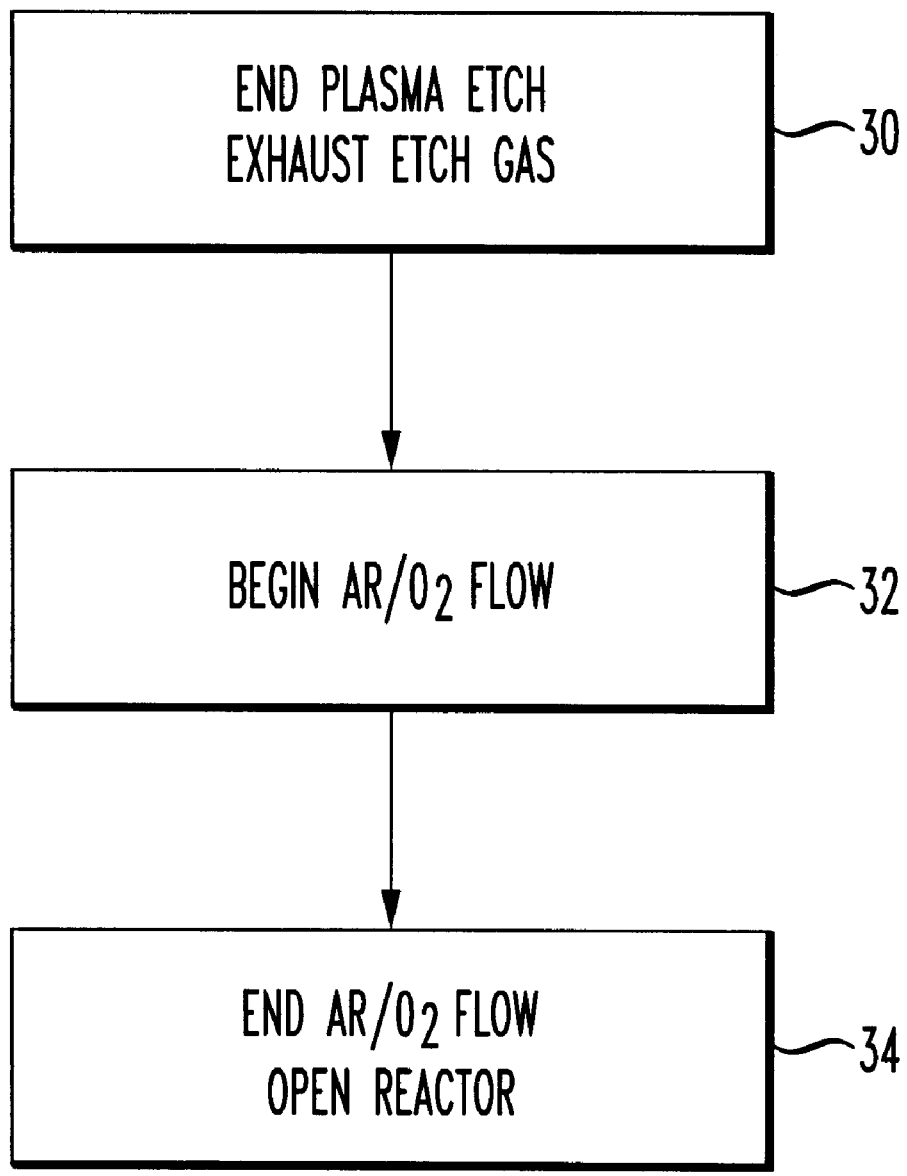
FIG. 3 is a flow chart illustrating processing steps including chamber outgassing of contaminants in a photoresist layer.

FIG. 3 is a simplified process flow chart of the new method. Block 30 represents the final step in conventional wafer processing in which the plasma chamber of the plasma reactor 10 is exhausted of the etchant gases. In this step, the etchant gas flow is terminated by conventional valve means and other valves (not shown) are opened to allow replacement of the etchant gases by a mixture of argon and oxygen. In block 32, the argon and oxygen mixture is controlled to allow a flow rate of about 50 sccm of argon and 18 sccm for oxygen. Pressure of the argon/oxygen mixture is maintain at about 100 mTorr by control of the exhaust valve of the reaction chamber. Power is maintained at about 500 watts but the magnetic field is off. At least some of the argon and oxygen is ionized to form $Ar^-$ and $O^+$ ions which then bombard the outer surface of the photoresist to remove at least a portion of the surface. It has been found that 10 seconds at the describe flow rate and power is sufficient to remove at least the majority of the photoresist surface in which the fluorine ($F^-$) and sulfur ($S^-$) ions are entrapped. The fluorine and sulfur ions are exhausted from the reactor chamber with the outflow of argon and oxygen. The fluorine and sulfur ions combine with carbon and oxygen ions in the gas flow to create $CF_2$ and $SO_2$. As is known, the exhaust gases are then passed through a conventional scrubber to remove the contaminant compounds before releasing the gases to atmosphere. In block 34, the argon/oxygen mixture is turned off and the reactor 10 is opened to remove the wafers.

While the process of de-contamination of the photoresist layer of a semiconductor wafer has been described in the context of fluorine and sulfur contamination, it will be recognized that other contaminants may be present and that the process may be extended to such other contaminants by variation of the parameters disclosed herein, including the mixture of gases used in the decontamination process. Further, the time, pressure, flow rates and power are given for reference values and may be varied as a function of other variables in the overall wafer process, including the type of plasma reactor, the gases used for etching, the number and size of wafers as well as other variables.

What is claimed is:

1. A method of plasma chamber etching of a semiconductor structure having a base layer, an etch stop layer, a dielectric material layer and a patterned photoresist layer, the method comprising:

etching selected portions of the dielectric material layer through the photoresist layer using a plasma etchant containing at least one of fluorine and sulfur in a compound such that portions of the photoresist layer may be contaminated with ions of the at least one of the fluorine and sulfur;

exhausting the etchant from the plasma chamber;

introducing an oxygen containing gas into the plasma chamber;

energizing the plasma chamber to create at least oxygen ions for bombarding the photoresist surface to remove at least a portion of the photoresist containing a majority of the contaminating one of the fluorine and sulfur ions whereby the fluorine and sulfur ions combine with other ions in the oxygen containing gas during at least exhaustion of the gas from the chamber; and removing the semiconductor structure containing a remaining portion of the photoresist from the plasma chamber.

2. The method of claim 1 wherein the etchant comprises at least one of the gases of $SF_6$, $CHF_3$, and $CF_4$.

3. The method of claim 1 wherein the oxygen containing gas comprises a mixture of oxygen and argon.

4. The method of claim 3 wherein the plasma reactor is energized for a time period sufficient to remove only an outer layer of photoresist material containing fluorine and sulfur ions.

5. The method of claim 4 wherein the photoresist is a carbon containing compound and the bombardment of the photoresist releases carbon ions for combining with the fluorine ions.

6. The method of claim 5 wherein the time period is about 10 seconds and the plasma reactor is energized at about 500 watts.

7. A method for in situ removal of plasma gas contamination of a photoresist layer on a semiconductor wafer in a chamber of a plasma reactor comprising:

exhausting the plasma gas from the reactor chamber; and introducing an oxygen containing gas into the chamber for a time period sufficient to allow the plasma gas contamination to outgas from a remaining portion of the photoresist layer and combine with elements of the oxygen containing gas.

8. The method of claim 7 wherein the oxygen containing gas comprises a mixture of oxygen and argon.

9. The method of claim 8 wherein the argon is flowed into the chamber at a rate of about 50 sccm.

10. The method of claim 8 wherein the oxygen is flowed into the chamber at a rate of about 18 sccm.

11. The method of claim 7 wherein the semiconductor wafer is exposed to the oxygen containing gas for a time period of about 10 seconds.

12. The method of claim 7 wherein the fluorine and the sulfur ions are outgassed from the portion of the photoresist layer by operating the plasma reactor so as to bombard a surface of the photoresist material with oxygen ions.

13. The method of claim 11 wherein the plasma reactor is operated at a power level of about 500 watts.

14. A method of rapid outgassing of plasma etch gas entrapped in a photoresist layer of a semiconductor wafer subsequent to a process of plasma etching in a chamber of a plasma reactor comprising:

terminating the plasma etching process;

exhausting the plasma etch gases from the plasma chamber;

flowing an oxygen enriched gas through the plasma chamber for a time period sufficient to allow a major portion of the entrapped gases to react with the oxygen in a remaining portion of the photoresist layer;

energizing the plasma reactor while the oxygen enriched gas is flowing; and removing the semiconductor wafer from the plasma reactor.

15. The method of claim 14 wherein the oxygen enriched gas comprises an argon and oxygen mixture.

16. The method of claim 15 wherein the argon is flowed into the plasma reactor at a different flow rate than the oxygen.

17. The method of claim 16 wherein the argon is flowed into the plasma reactor at a different flow rate than the oxygen.

18. The method of claim 16 wherein the oxygen is flowed into the plasma reactor at about 18 sccm.

19. The method of claim 14 wherein the time period is about 10 seconds.

20. The method of claim 19 wherein the plasma reactor is operated at a power level of about 500 watts.

* * * * *